(12) United States Patent
Akram

(10) Patent No.: US 6,175,149 B1
(45) Date of Patent: Jan. 16, 2001

(54) MOUNTING MULTIPLE SEMICONDUCTOR DIES IN A PACKAGE

(75) Inventor: Salman Akram, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/023,547

(22) Filed: Feb. 13, 1998

(51) Int. Cl.$^7$ .................................................. H01L 23/495
(52) U.S. Cl. ............... 257/676; 257/672; 257/690; 257/723; 257/724; 361/723; 361/772
(58) Field of Search ................... 257/668, 676, 257/686, 724, 725, 672, 692, 723, 787, 690, 666; 438/123, 124, 126, 127; 361/723, 772

(56) References Cited

U.S. PATENT DOCUMENTS

| | | | |
|---|---|---|---|
| 5,012,323 | 4/1991 | Farnworth | 438/107 |
| 5,114,880 | 5/1992 | Lin | 257/723 |
| 5,147,815 * | 9/1992 | Casto | 438/107 |
| 5,471,369 * | 11/1995 | Honda et al. | 361/813 |
| 5,479,051 * | 12/1995 | Waki et al. | 247/724 |
| 5,689,135 * | 11/1997 | Ball | 257/676 |
| 5,804,874 * | 9/1998 | An et al. | 257/676 |
| 5,917,242 * | 6/1999 | Ball | 257/737 |

FOREIGN PATENT DOCUMENTS

| | | |
|---|---|---|
| 461639 * | 6/1991 | (EP) . |
| 56-062351 * | 5/1981 | (JP) . |
| 3-169062 * | 7/1991 | (JP) . |
| 4-48767 * | 2/1992 | (JP) . |

* cited by examiner

Primary Examiner—Olik Chaudhuri
Assistant Examiner—Alonzo Chambliss
(74) Attorney, Agent, or Firm—Trop, Pruner & Hu, P.C.

(57) ABSTRACT

A multiple die package may include a pair of dies having bonding pads and a front surface on which the bonding pads are located. The front surface is facing the same direction. At least one of the dies is secured to a lead frame. A spacer spaces the die from one another. At least one of the dies is spaced from the leadframe by a distance greater than the thickness of the die.

3 Claims, 3 Drawing Sheets

MOUNTING MULTIPLE SEMICONDUCTOR DIES IN A PACKAGE

BACKGROUND

The invention relates to mounting multiple semiconductor dies in a package.

A typical semiconductor device starts with a single die that is sawed from a silicon wafer. Circuitry is formed on the die by a series of deposition, masking, diffusion, etching, and implanting steps. The back of the die is bare. The die is attached to the leadframe by an adhesive layer that can also serve to electrically insulate the die from the leadframe. The die is then electrically connected to the leadframe by wire-bonding the lead fingers of the leadframe to a bonding pads disposed around the periphery of the die (conventional configuration), or down the center of the die in a lead-on-chip (LOC configuration). After wirebonding, the die and the leadframe are encapsulated in a molded plastic package that is hermetically sealed to protect the die from moisture and physical stress. The lead fingers extend outside the plastic package to form leads that are folded down the side of the plastic package.

Various methods have been developed to increase package density. For example, U.S. Pat. No. 5,012,323, having the same assignee as the present application, discloses a semiconductor package incorporating a pair of conventional semiconductor dies (a first die mounted over a second die) on a single leadframe. The bonding pads on a conventional die are located on its periphery. To enable the bonding pads of the second die to be wirebonded to the leadframe, the rectangular surface area of the first die (mounted over the second die) is shown as being smaller than that of the second die.

SUMMARY

In accordance with one aspect of the present invention, a multiple die package includes a pair of dies having bonding pads and front surfaces on which the bonding pads are located, the front surfaces facing oppositely from one another. The package also includes a leadframe. One of the dies is secured on the leadframe. A bond pad of that die is electrically connected to the leadframe.

In accordance with another aspect of the present invention, a multiple die package includes a pair of dies having bonding pads and front surfaces on which the bonding pads are located, the front surfaces facing in the same direction. The package also includes a leadframe. At least one of the dies is secured to the leadframe. A spacer is used for spacing the dies from one another.

In accordance with yet aspect of the present invention, a method involves mounting multiple semiconductor dies on a single leadframe by stacking at least two semiconductor dies having about the same rectangular dimensions on top of one another. The stacked dies are electrically connected to the leadframe.

In accordance with but another aspect of the present invention, a method of connecting multiple semiconductor dies having bonding pads and a single leadframe having lead fingers includes mounting a first semiconductor die on the lead fingers of the leadframe. A second semiconductor die is stacked on the first semiconductor die. The bonding pads of the semiconductor dies are electrically connected to the lead fingers of the leadframe.

In accordance with another aspect of the present invention, a semiconductor device includes a plurality of semiconductor dies having about the same rectangular dimensions. A leadframe has lead fingers to which the semiconductor dies are mounted. Connectors electrically connect the dies to the leadframe.

In accordance with yet another aspect of the present invention, a semiconductor device has a leadframe with a first surface, a second surface opposite the first surface, and lead fingers. A first die is located on the first surface, the first die having bond pads which are electrically contacted to the lead fingers on the first surface of the leadframe. A second die is located on the second surface, the second die having bond pads which are electrically contacted to the lead fingers on the second surface of the leadframe.

In accordance with but another aspect of the present invention, an integrated circuit package has a leadframe with first and second surfaces. A support member is mounted to a first surface of the leadframe. A first die is mounted to the support member, and a second die is mounted to a second surface of the leadframe.

Advantages of the invention include one or more of the following: a higher density integrated circuit device, multiple dies having the same size may be mounted on a single leadframe, and a semiconductor package having both LOC and conventional dies. Other advantages will become apparent from the following description.

DETAILED DESCRIPTION

Figure 1:
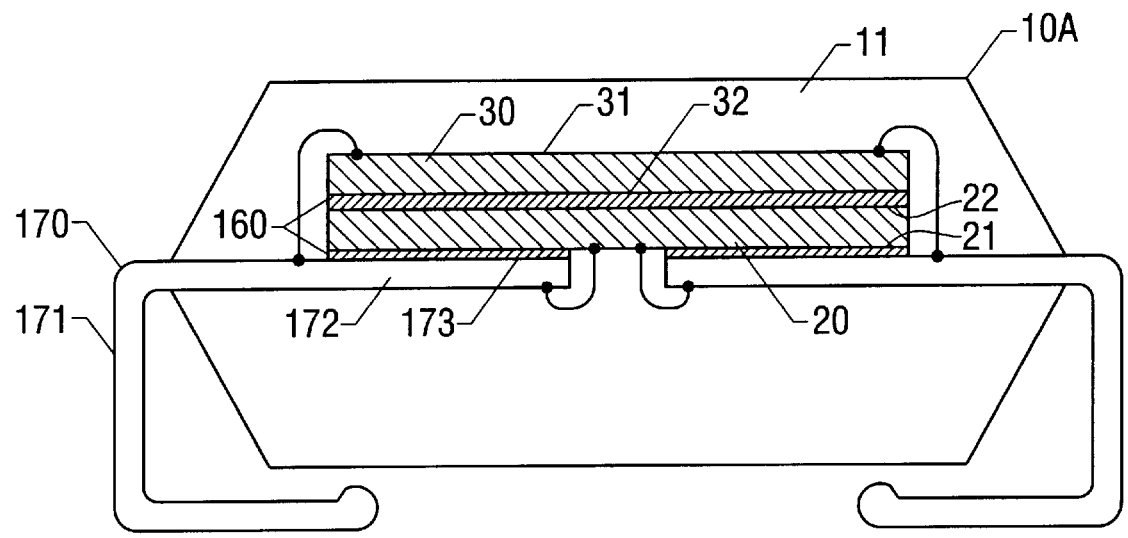
FIG. 1 is an enlarged, cross-sectional view of a semiconductor device having first and second dies mounted on a leadframe.

Referring to FIG. 1, a semiconductor package 10A includes a first semiconductor die 20 and a second semiconductor die 30 stacked one on top of the other, and a leadframe 170 encapsulated by a package body 11. The package body 11 hermetically seals the first die 20, second die 30 and the leadframe 170 to protect the dies 20, 30 and the leadframe 170 from moisture and physical stress and mechanical damage. The package body 11 may be made of, for example, plastic, ceramic, or other hard and durable material, and may be a dual inline package (DIP), small outline J-lead package (SOJ), thin small outline package (TSOP), or any other type package.

The first die 20, which may have an LOC configuration, is mounted face down on the leadframe 170, with its face 21 adjacent a top surface 173 of the leadframe 170. The die 20 may be adhered to the leadframe 170 by an adhesive layer 160. The second die 30, which has a conventional configuration, is mounted face up on the first die 20, with its back 32 adjacent the back 22 of the first die 20, and adhered to the first die 20 by the adhesive layer 160. The adhesive layer 160 may be a nonconductive double adhesive tape such as the type conventionally used in LOC packages. Alternatively, a conductive adhesive layer can be used if a common electrical connection between the two die is required such as ground.

The leadframe 170 may be made of metal, for example, Alloy-42, and has leads 171 and lead fingers 172. The lead fingers 172 are encapsulated within the package body 11 and extend towards a center of the package body 11. The leads 171 extend outside the package body 11 and may be formed into through-holes, J-leads, gull wings, or other variations thereof. To facilitate soldering of leads 171 to an interconnecting structure, leads 171 may be tin plated or solder dipped.

One advantage of the semiconductor device 10A is that multiple dies may be conveniently encapsulated in a single package body. Another advantage of is that the multiple dies may have the same or may not have the same rectangular dimensions, even though both are shown as having the same dimensions in FIG. 1.

Figure 2:
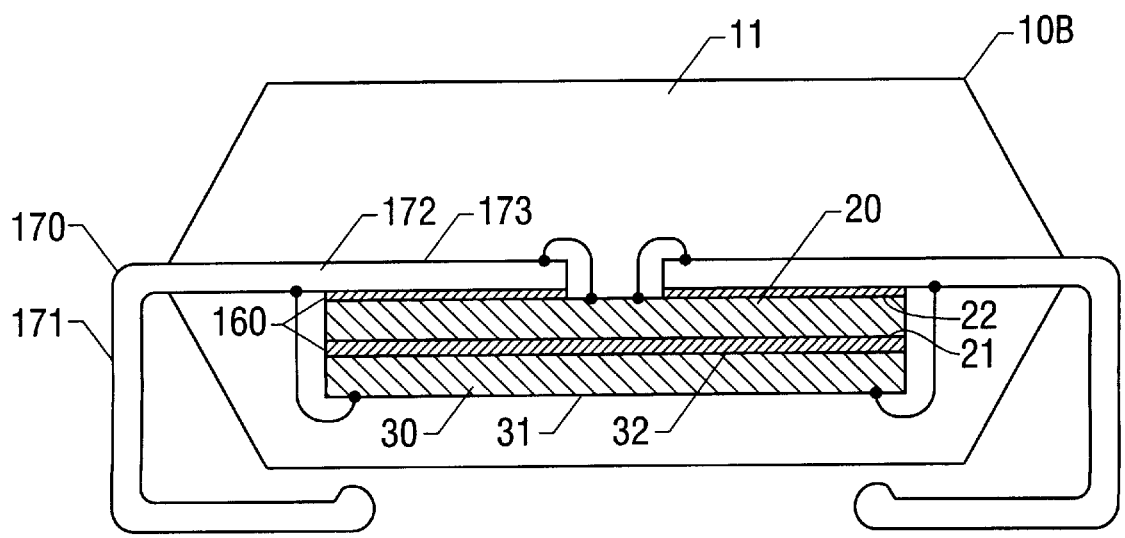
FIG. 2 is an enlarged, cross-sectional view of a semiconductor device having first and second dies mounted underneath a leadframe.

Referring to FIG. 2, a semiconductor package 10B includes a first LOC die 20 and the second conventional die 30 stacked one on top of the other. The face 21 of the first die 20 is oriented upwardly and is mounted to a bottom surface 174 of the leadframe 170. The face 31 of the other die 30 is directed away from the die 20. Otherwise, the embodiments shown in FIGS. 1 and 2 are the same.

Figure 3:
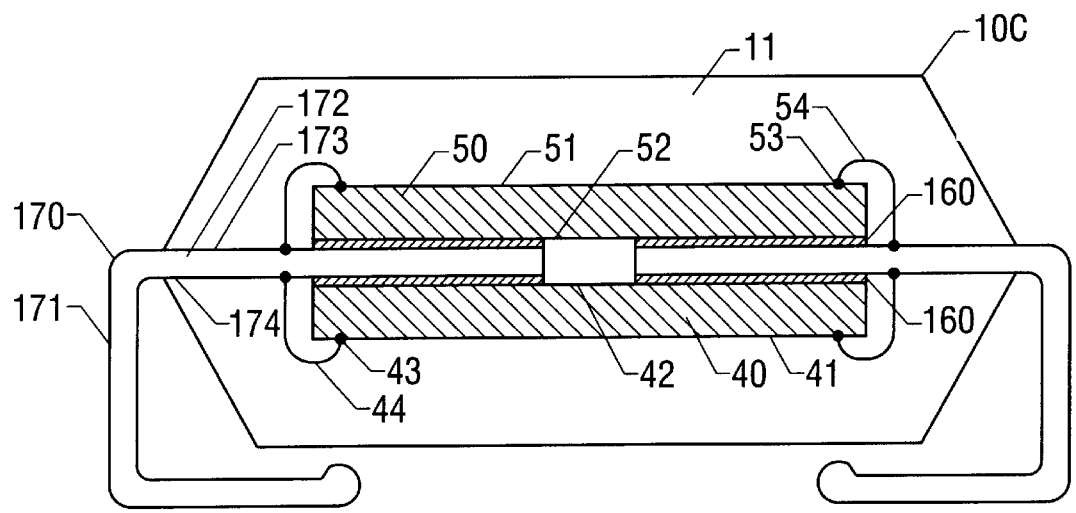
FIG. 3 is an enlarged, cross-sectional view of a semiconductor device having first die mounted on top of a leadframe and a second die mounted underneath the leadframe.

A semiconductor package 10C, shown in FIG. 3, includes a first conventional die 40, a second conventional die 50, and a leadframe 170 encapsulated within the package body 11. A back 42 of the first die 40 is mounted on the bottom surface 174 of the leadframe 170 by the adhesive layer 160. The back 52 of the second die 50 is mounted to the top surface 173 of the leadframe 170 and adhered to leadframe 170 by another adhesive layer 160. Thus, the dies 40 and 50 face oppositely from one another. The first die 40 and second die 50 have a plurality of bonding pads 43 and 53 disposed along the periphery of their face 41 and 51. Bonding wires 44 and 54 of the dies 40 and 50 electrically connect bonding pads 43 and 53 to the lead fingers 172.

Figure 4:
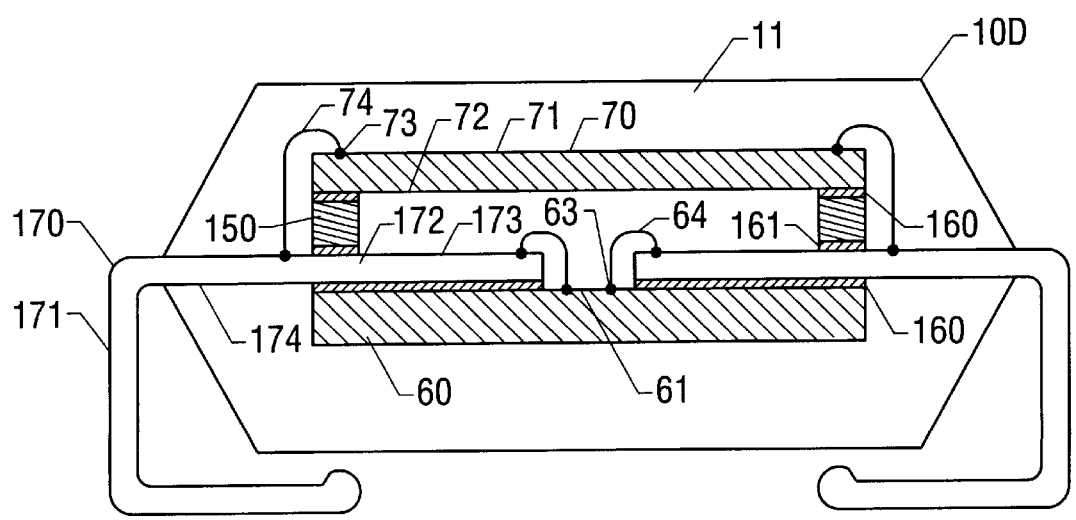
FIG. 4 is an enlarged, cross-sectional view of a semiconductor device having first die mounted on a support frame that is mounted on top of a leadframe and a second die mounted underneath the leadframe.

Referring now to FIG. 4, a semiconductor package 10D includes a first LOC die 60 mounted to the leadframe 170 with its face 61 adjacent the bottom surface 174 of the leadframe 170. A rectangular spacer 150 is attached to the top surface 173 of the leadframe 170 by an adhesive layer 161. This spacer can be in the form of two single strips or a window frame shape. The back 72 of a second conventional die 70 is mounted to the spacer 150 and adhered to the support frame 150 by the adhesive layer 160. The spacer 150, which may be made of a nonconductive material such as plastic, spaces the die 70 from the leadframe 170 and allows the dies 60 and 70 to face in the same direction.

The first die 60 has a plurality of bonding pads 63 disposed on its face 61 generally down the center of the die 60. The second die 70 has a plurality of bonding pads 73 disposed on its face 71 along the periphery. A plurality of bonding wires 64 and 74 electrically connect the bonding pads 63 and 73 to the lead fingers 172.

Figure 5:
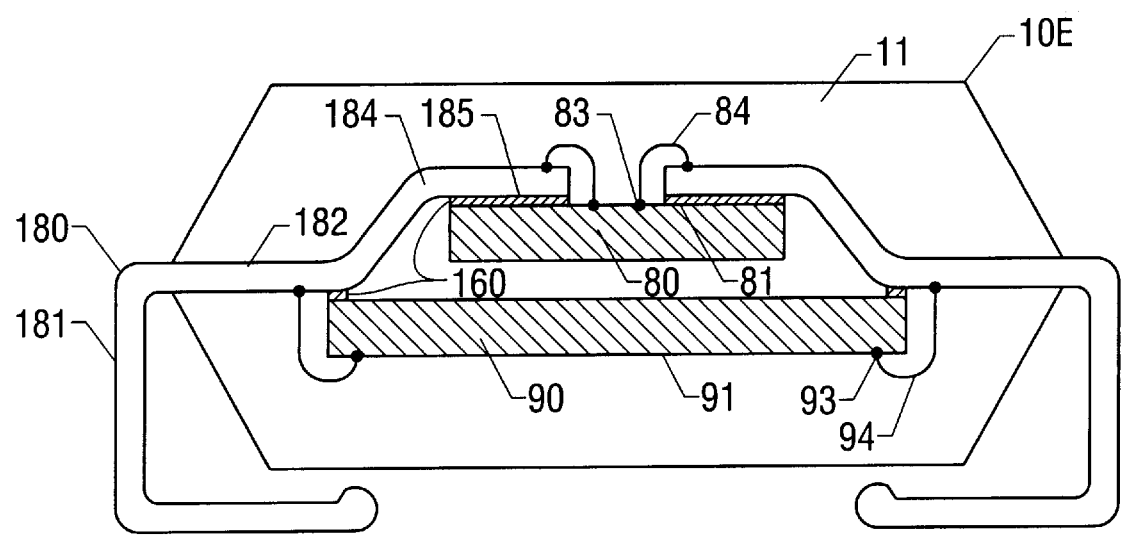
FIG. 5 is an enlarged, cross-sectional view of a semiconductor device having first die mounted under an offset portion of a leadframe and a second die mounted on the leadframe under and spaced apart from the first die.

Referring now to FIG. 5, a semiconductor package 10E has a package body 11 that encapsulates a first upwardly facing LOC die 80, a second downwardly facing conventional die 90, and a leadframe 180. The leadframe 180 has leads 181 and lead fingers 182. Additionally, the leadframe 180 has an offset portion 184 formed in the lead fingers 182. The first die 80 is mounted to the leadframe 180 with its face 81 adjacent a bottom surface 185 of the offset portion 184, adhered to leadframe 180 by the adhesive layer 160. The second die 90 is mounted to leadframe 180 with its back 92 adjacent the bottom surface 185 of the upset portion 184 spaced apart from first die 80. The die 90 is adhered to the leadframe 180 by the adhesive layer 160.

The first die 80 has a plurality of bonding pads 83 disposed on its face 81 generally down the center. The second die 90 has a plurality of bonding pads 93 disposed on its face 91 along the periphery. The bonding pads 83 and 93 are connected to the lead fingers 182 by bonding wires 84 and 94 respectively.

Because of the smaller surface area of the offset portion 184 of the leadframe 180 as compared to the lead fingers 172 of the leadframe 170, the first die 80 and the second die 90 need not have the same rectangular dimensions. The offset 184 allows each back to back die 80 and 90 to be conveniently contacted.

It is not necessary that the two dies use the same leads, as shown in FIG. 5, for illustration purposes only. Alternatively, the offset portion 184 may be downwardly rather than upwardly directed and the die mounted on top of the leadframe 120 rather than under it.

Figure 6:
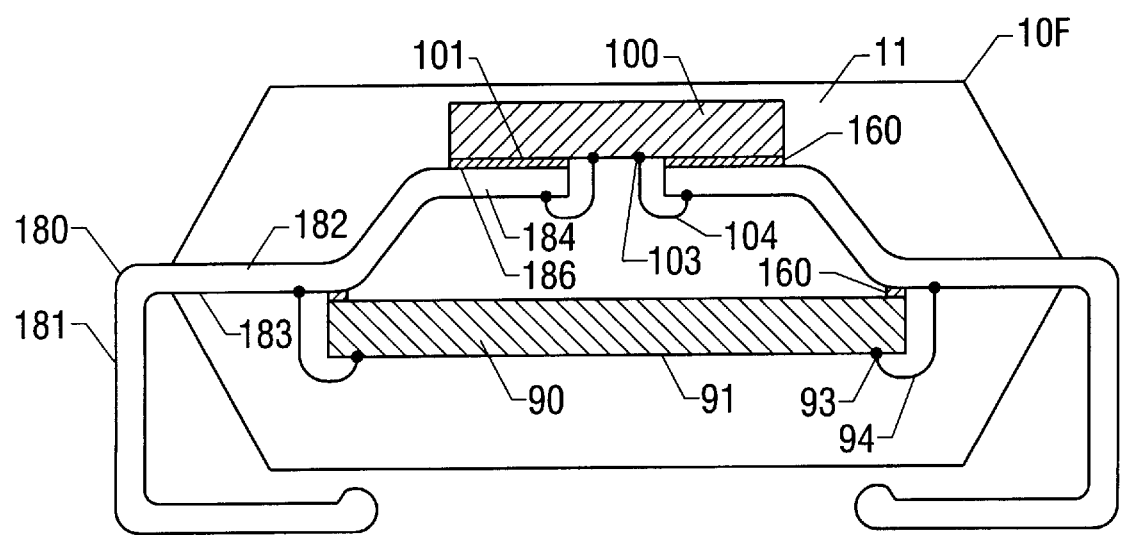
FIG. 6 is an enlarged, cross-sectional view of a semiconductor device having first die mounted on top of an offset portion of a leadframe and a second die mounted underneath the leadframe.

Referring now to FIG. 6, a semiconductor package 10F includes a first downwardly facing LOC die 100, a second downwardly facing conventional die 90, and a leadframe 180. The package 10F in FIG. 6 is the same as the package 10E in FIG. 5 except for the first die 100, which may be the same size as the die 90. The first die 100 is mounted to the leadframe 180 with its face 101 adjacent a top surface 186 of the offset portion 184, and adhered to leadframe 180 by the adhesive layer 160. Bonding pads 103 are disposed on the face 101 of the first die 100 generally down the center of the first die 100. Bonding wires 104 electrically connect the bonding pads 103 to the lead fingers 182. Alternatively, the offset 184 may be downwardly directed instead of upwardly directed so that the die 100 is on the bottom and the die 90 is on the top.

It is to be understood that the embodiments described above are merely illustrative of some of the many specific embodiments of the invention, and that other arrangements can be devised by one of ordinary skill in art at the time the invention was made without departing from the scope of the invention. For example, although FIGS. 1–6 illustrate packages with two dies, more dies may be mounted on a single leadframe.

What is claimed is:

1. A multiple die package comprising:
   a pair of dies having bonding pads and front surfaces on which said bonding pads are located, said front surfaces facing in the same direction;
   a leadframe, at least one of said dies secured to said leadframe; and
   a spacer for spacing said dies from one another, said spacer is secured to said leadframe and one of said dies is secured to said spacer, wherein at least one of said dies being spaced from said leadframe by a distance grater than the thickness of said die.

2. The package of claim 1, wherein said spacer is integral with said leadframe.

3. The package of claim 2, wherein said spacer is formed by an offset portion of said leadframe.

* * * * *